(12) United States Patent
Xiong

(10) Patent No.: US 9,333,687 B2
(45) Date of Patent: May 10, 2016

(54) LIGHT REFLECTION DEVICE AND MANUFACTURE METHOD OF THE SAME

(75) Inventor: Kang Zhuang Xiong, Shanghai (CN)

(73) Assignee: Shanghai Huyu Industrial Co., Ltd., Shanghai (CN)

( * ) Notice: Subject to any disclaimer, the term of this patent is extended or adjusted under 35 U.S.C. 154(b) by 530 days.

(21) Appl. No.: 13/548,786

(22) Filed: Jul. 13, 2012

(65) Prior Publication Data

US 2013/0329294 A1    Dec. 12, 2013

(30) Foreign Application Priority Data

Jun. 6, 2012  (CN) .......................... 2012 1 0183675

(51) Int. Cl.
| | | |
|---|---|---|
| B29C 45/00 | (2006.01) | |
| B29C 45/14 | (2006.01) | |
| B32B 27/12 | (2006.01) | |
| B32B 27/34 | (2006.01) | |
| B32B 27/36 | (2006.01) | |
| C23C 14/00 | (2006.01) | |
| F24J 2/10 | (2006.01) | |
| G02B 1/10 | (2015.01) | |
| G02B 5/08 | (2006.01) | |
| G02B 5/10 | (2006.01) | |
| G02B 19/00 | (2006.01) | |
| B29K 105/06 | (2006.01) | |
| B29L 11/00 | (2006.01) | |

(52) U.S. Cl.
CPC ......... *B29C 45/0005* (2013.01); *B29C 45/0053* (2013.01); *B32B 27/12* (2013.01); *B32B 27/34* (2013.01); *B32B 27/36* (2013.01); *B32B 27/365* (2013.01); *C23C 14/00* (2013.01); *F24J 2/1057* (2013.01); *G02B 1/10* (2013.01); *G02B 5/0841* (2013.01); *G02B 5/10* (2013.01); *G02B 19/00* (2013.01); *B29C 45/14* (2013.01); *B29C 2045/0079* (2013.01); *B29K 2105/06* (2013.01); *B29L 2011/0058* (2013.01); *B32B 2255/10* (2013.01); *B32B 2307/416* (2013.01); *B32B 2551/00* (2013.01); *B32B 2551/08* (2013.01); *F24J 2002/1071* (2013.01)

(58) Field of Classification Search
CPC ..................................................... F24J 2/1057
USPC ......... 359/359–360, 577, 580, 584–586, 588, 359/838, 871, 883; 126/684–697; 136/246; 428/411.1–703
See application file for complete search history.

(56) References Cited

U.S. PATENT DOCUMENTS

| | | | | |
|---|---|---|---|---|
| 4,191,164 | A * | 3/1980 | Kelly ............................ | 126/683 |
| 4,358,503 | A * | 11/1982 | Homeyer ..................... | 428/40.1 |
| 4,875,766 | A * | 10/1989 | Shimodaira .............. | G02B 5/08 359/883 |
| 5,208,704 | A * | 5/1993 | Zito ........................ | G02B 5/08 359/848 |
| 5,428,483 | A * | 6/1995 | Sato et al. ..................... | 359/838 |
| 2006/0092535 | A1* | 5/2006 | Romeo ......................... | 359/883 |
| 2007/0223096 | A1* | 9/2007 | O'Connor ............... | F24J 2/1057 359/584 |
| 2009/0101208 | A1* | 4/2009 | Vandal et al. ................ | 136/259 |
| 2011/0102926 | A1* | 5/2011 | Abbott et al. ................ | 359/883 |

FOREIGN PATENT DOCUMENTS

WO      WO98/02199      1/1995

* cited by examiner

*Primary Examiner* — Kimberly N Kakalec
(74) *Attorney, Agent, or Firm* — Wang Law Firm, Inc.

(57) ABSTRACT

A light reflection device includes a composite substrate, a mirror plastic film securely affixed to the composite substrate and a reflection coating affixed to the composite substrate with the mirror plastic film sandwiched therebetween.

9 Claims, 4 Drawing Sheets

LIGHT REFLECTION DEVICE AND MANUFACTURE METHOD OF THE SAME

BACKGROUND OF THE INVENTION

1. Field of the Invention

The present invention is related to a reflection device for reflecting solar light beam, as well as the manufacture method of the same and, more particularly, to a reflection device composed of a composite substrate, a mirror plastic file on top of the composite substrate and a reflection coating on top of the mirror plastic and to the manufacture method of the same.

2. Description of Related Art

In recent years, solar energy technology is dramatically developed as natural resource is getting used up and a need for alternative power is imminent. Comparatively speaking, solar energy is free and is easy to have access to this unlimited energy, scientists are all trying their best to explore how we can use this energy for the most effectiveness. During which, a technology using solar energy to generate electricity is widely explored. While exploring the extent of this technology, the light reflecting and converging system is mostly concerned. Currently, the study focuses on the application of glass or aluminum for light convergence. The glass surface or aluminum surface is specially processed to have the ultimate light reflection effect. However, when the glass or aluminum is processed, rebound of the material easily causes the size of the finished product unstable.

SUMMARY OF THE INVENTION

The primary objective of the present invention is to provide a reflection device composed of a composite substrate, a mirror plastic film and a reflection coating securely on top of the mirror plastic film through which the reflection coating is attached to the surface of the composite substrate. The composite substrate is formed by long fiber injection process (LEI) and the reflection coating is plated on the mirror plastic film via physical vapor deposition; PVD. Furthermore, a hard coating is applied on top of the reflection coating. The composite substrate may be made of by the combination of a variable fiber and a material selected from the group consisting of: polyurethane, PU; epoxy resin, pure polyurea or dicyclopentadiene, DCPD. The variable fiber includes glass fiber, carbon fiber or the like. The mirror plastic film may be made of a material consisting of polyethylene terephthalate, PET; polymethulmethacrylate, PMMA; polycarbonate, PC; or acrylonitrile butadiene styrene, ABS. In addition, a heat conversation layer is sandwiched between the mirror plastic film and the composite substrate.

Still further, the manufacture method for making the reflection device constructed in accordance with the present invention includes the steps of:

preparing a mold;

attaching a mirror plastic film into the mold;

injecting a base material into the mold and forming a composite substrate via long fiber injection;

plating a light reflection layer on the mirror plastic film; and applying a hard coating on the light reflection layer.

The light reflection layer is plated on the mirror plastic film via physical vapor deposition, PVD. The percentage of the base material is adjusted to allow the coefficient of linear extensibility (COLE) to match with that of supporting material for the composite substrate.

It is to be noted that the composite substrate is manufactured via LFI with injection molding. The stability of the size is great and the overall weight is light. Furthermore, with the help of different molds, auxiliary supporting structures are made, which greatly enhances its adaptability. The light reflection layer is used for reflection and incorporated with the shape of the composite substrate after reaction, the solar light is reflected in great effect. The hard layer is used to protect the light reflection layer from excessive wear, which prolongs the lifespan of the light reflection device of the present invention. The addition of the heat conservation layer is to prevent the surface of the device of the present invention from frosting, which guarantees the light reflection/convergence effect. What is more is that the coefficient of linear extensibility (COLE) of the base material is made to match with that of supporting material for the composite substrate, which prevents potential damage caused by differences between two COLEs.

DETAILED DESCRIPTION OF THE INVENTION

Figure 1:
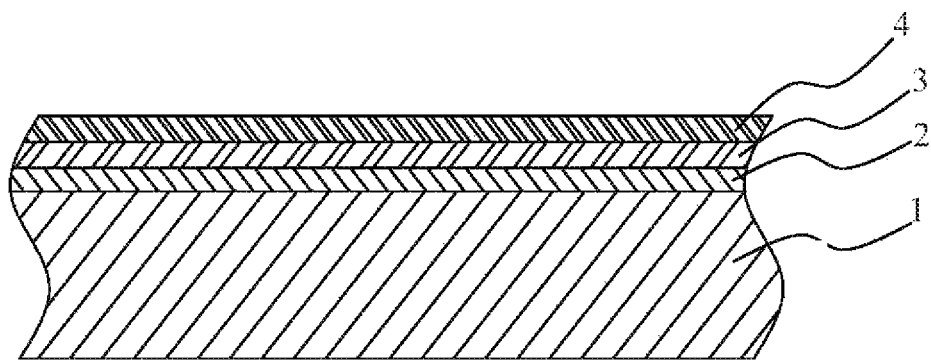
FIG. 1 is a schematic cross sectional view of the reflection device constructed in accordance with the preferred embodiment of the present invention.
Figure 4:
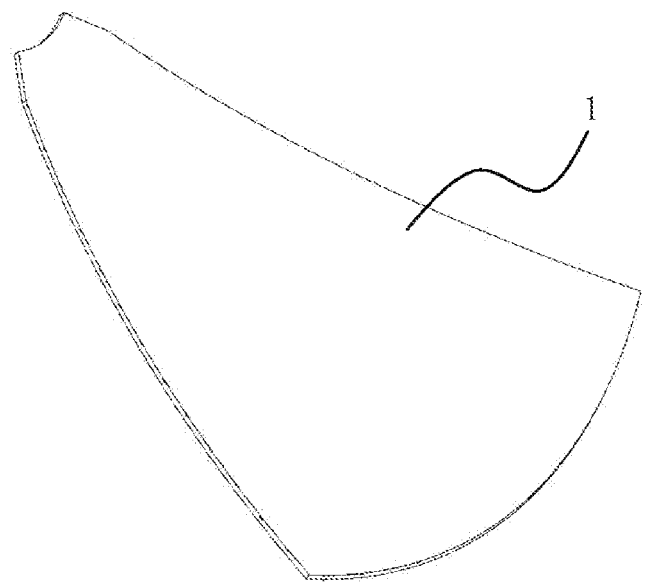
FIG. 4 is still a different schematic view showing the structure of the composite substrate of the preferred embodiment of the present invention.

With reference to FIGS. 1, it is noted that the light reflection device constructed in accordance with the present invention includes a composite substrate 1, a mirror plastic film 2 and a reflection coating 3. The reflection coating 3 is plated on the mirror plastic film 2 which is securely attached, i.e., gluing, to a side face of the composite substrate 1. The composite substrate 1 is formed by long fiber injection molding (LFI) and has an arcuate, sectorial shape. Preferably, the arcuate shape is a concave one, as shown in FIG. 4.

The reflection coating 3 is plated on the mirror plastic film 2 via physical vapor deposition (PVD) for reflection of the solar light, in co-operation with the shape of the composite substrate 1.

A hard layer 4 is applied on top of the reflection coating 3 to prevent the reflection coating 3 from excessive wear to the surface of the reflection coating 3 and guarantees the light convergence effect of the device of the present invention.

It is noted that the composite substrate 1 is made of such as the combination of a variable fiber and a material selected from the group consisting of: polyurethane, PU; epoxy resin, pure polyurea or dicyclopentadiene, DCPD. The variable fiber includes glass fiber, carbon fiber or the like. The mirror plastic film may be made of a material consisting of polyethylene terephthalate, PET; polymethulmethacrylate, PMMA; polycarbonate, PC; or acrylonitrile butadiene styrene, ABS.

Figure 3:
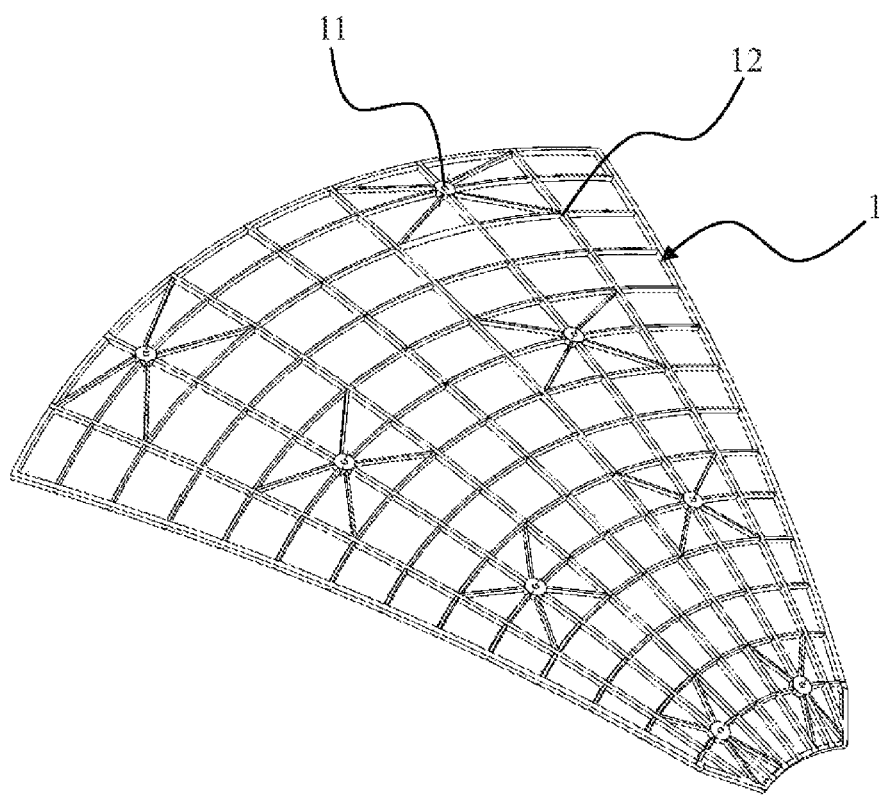
FIG. 3 is a schematic view showing the structure of the composite substrate of the preferred embodiment of the present invention.

With reference to FIG. 3, it is to be noted that because the composite substrate 1 is manufactured via LFI with injection molding, the stability of the size of the composite substrate 1 is great and the overall weight is light. Furthermore, with the help of different molds, auxiliary supporting structures such as reinforced ribs 12 and mounting holes 11 or the like are made, which greatly enhances its adaptability when adapted to other devices. What is more is that the coefficient of linear extensibility (COLE) of the base material is made to match with that of supporting material for the composite substrate, which prevents potential damage caused by differences between two COLEs.

The reflection device of the present invention may be formed by the steps as follows:

preparing a mold;

attaching a mirror plastic film 2 into the mold;

injecting a base material with adjusted percentage of its materials to have a coefficient of linear extensibility consistent to that of a supporting material for the composite substrate 1 into the mold and forming a composite substrate via long fiber injection;

plating a light reflection layer 3 on the mirror plastic film 2 via PVD; and applying a hard coating 4 on the light reflection layer 3.

Figure 2:
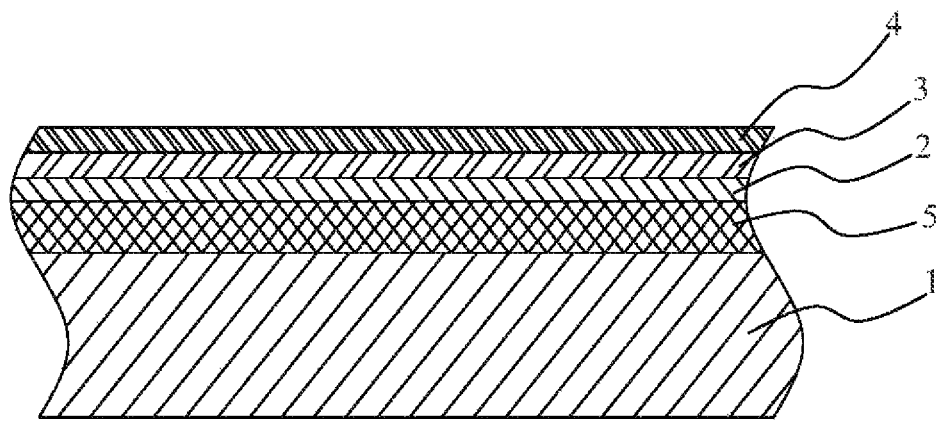
FIG. 2 is still a schematic cross sectional view showing another light reflection device constructed in accordance with the preferred embodiment of the present invention.

Another embodiment of the present invention indicates, as shown in FIG. 2, that the addition of the heat conservation layer 5 between the composite substrate 1 and the mirror plastic film 2 is to prevent the surface of the device of the present invention from frosting, which guarantees the light reflection/convergence effect.

Figure 5:
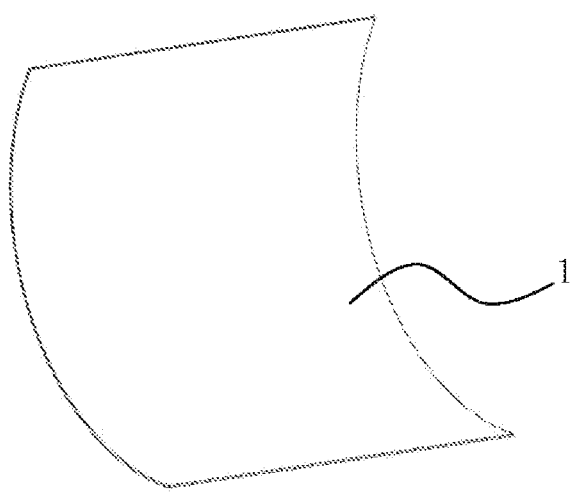
FIG. 5 is a schematic view showing the second embodiment of the structure of the composite substrate of the present invention.

With reference to FIG. 5, the heat conservation layer 5 is securely affixed to the surface of the mirror plastic film 2 before the base material is injected into the mold. After the heat conservation layer 5 is affixed to the mirror plastic film 2, the base material is processed inside the mold to form the composite substrate 1 via LFI. The mirror plastic film 2 is affixed to the composite substrate 1 via the heat conservation layer 5.

Figure 6:
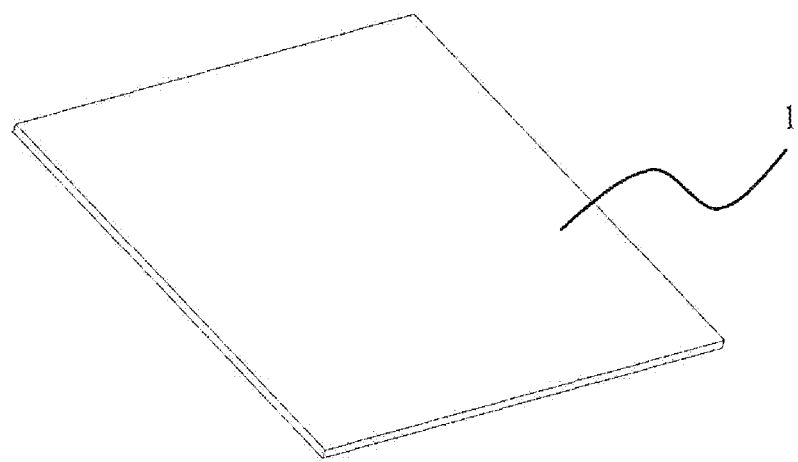
FIG. 6 is another schematic view showing a different embodiment of the composite substrate of the present invention.

With reference to FIG. 6, another embodiment of the present invention is shown. The composite substrate 1 is a flat plate.

While the invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A solar light convergence and reflection device comprising:
    a composite substrate with an arcuate shape formed by long fiber injection molding process;
    a mirror plastic film securely affixed to the composite substrate;
    a reflection coating affixed directly onto the mirror plastic film through physical vapor deposition; and
    a heat conservation layer disposed between the composite substrate and the minor plastic film,
    wherein
        the composite substrate further comprising reinforced ribs and mounting holes formed by injecting a base material, through the long fiber injection molding process, into a mold with the reinforced ribs and the mounting holes, and
        the base material has a coefficient of linear extensibility made to match the coefficient of linear extensibility of a supporting material.

2. The solar light convergence and reflection device of claim 1, wherein a hard layer is applied to a surface of the reflection coating.

3. The solar light convergence and reflection device of claim 2, wherein the composite substrate is made by combining a fiber with a material selected from a group consisting of polyurethane, epoxy resin, pure polyurea and dicyclopentadiene.

4. The solar light convergence and reflection device of claim 3, wherein the mirror plastic film is made of a material consisting of polyethylene terephthalate, polymethulmethacrylate, polycarbonate, or acrylonitrile butadiene styrene.

5. A solar light convergence and reflection device comprising:
    a composite substrate made from a base material made by combining a fiber and a material selected from a group consisting of polyurethane, epoxy resin, pure polyurea, and dicyclopentadiene;
    a mirror plastic film securely affixed to the composite substrate;
    a reflection coating affixed directly onto the mirror plastic film through physical vapor deposition; and
    a heat conservation layer is disposed between the composite substrate and the mirror plastic film,
    wherein the composite substrate further comprising reinforced ribs and mounting holes formed by injecting the base material, through the long fiber injection molding process, into a mold with the reinforced ribs and the mounting holes and
    the base material has a coefficient of linear extensibility made to match the coefficient of linear extensibility of a supporting material.

6. The solar light convergence and reflection device of claim 5, wherein the composite substrate has an arcuate shape formed by long fiber injection molding process.

7. The solar light convergence and reflection device of claim 5, wherein a hard layer is applied to a surface of the reflection coating.

8. The solar light convergence and reflection of claim 5, wherein the mirror plastic film is made of a material consisting of polyethylene terephthalate, polymethulmethacrylate, polycarbonate, or acrylonitrile butadiene styrene.

9. A solar light convergence and reflection device prepared by a process comprising:
    disposing a plastic film in a mold with reinforced ribs and mounting holes;
    affixing a heat conservation lawyer to the plastic film;
    injecting, through a long fiber injection molding process, a base material into the mold to form a composite substrate; and
    plating a light reflection layer onto the plastic film through a physical vapor deposition process,
    wherein the solar light convergence and reflection device is reinforced with the reinforced ribs, and
    the base material has a coefficient of linear extensibility made to match the coefficient of linear extensibility of a supporting material.

* * * * *